(12) United States Patent
Foroudi

(10) Patent No.: US 9,461,633 B1
(45) Date of Patent: Oct. 4, 2016

(54) DUAL MODE LATCH CIRCUIT

(71) Applicant: Navid Foroudi, Ottawa (CA)

(72) Inventor: Navid Foroudi, Ottawa (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/858,494

(22) Filed: Sep. 18, 2015

(51) Int. Cl.
*H03M 9/00* (2006.01)
*H03K 3/356* (2006.01)

(52) U.S. Cl.
CPC ......... *H03K 3/356104* (2013.01); *H03M 9/00* (2013.01)

(58) Field of Classification Search
CPC ............... H03K 3/356104; H03M 9/00
USPC ............ 341/100, 101, 122, 118, 120, 68, 69
See application file for complete search history.

(56) References Cited

U.S. PATENT DOCUMENTS

| | | | | |
|---|---|---|---|---|
| 5,473,571 A * | 12/1995 | Shigematsu | ........... | G11C 14/00 365/189.02 |
| 6,696,995 B1 * | 2/2004 | Foley | ....................... | H03M 9/00 341/100 |
| 8,471,595 B1 * | 6/2013 | Austin | ............... | H03K 3/35606 326/12 |
| 2006/0067440 A1 * | 3/2006 | Hsu | ....................... | H03F 1/3241 375/345 |
| 2008/0081235 A1 * | 4/2008 | Yamaga | ............ | H01M 8/04007 429/429 |
| 2014/0093015 A1 * | 4/2014 | Xiu | ....................... | H03L 7/0807 375/340 |

* cited by examiner

*Primary Examiner* — Peguy Jean Pierre

(57) ABSTRACT

A latch circuit that has a dynamic mode and a static mode is provided. Clock signals are generated specifically for a feedback path of a storage circuit in the latch circuit. The generated clock signals include transitions that cause clocked NMOS and PMOS devices in the feedback path to function, and for other input clock frequencies, the generated clock signals do not include transitions that cause the clocked PMOS and NMOS devices to be active, and have states that cause clocked PMOS and NMOS devices to be inactive.

22 Claims, 13 Drawing Sheets

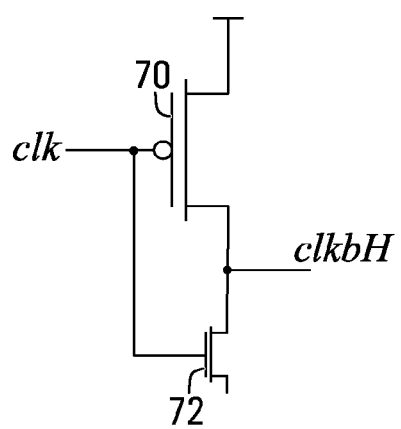 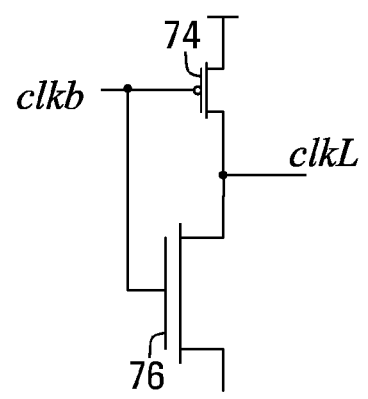
FIG. 4A                FIG. 4B

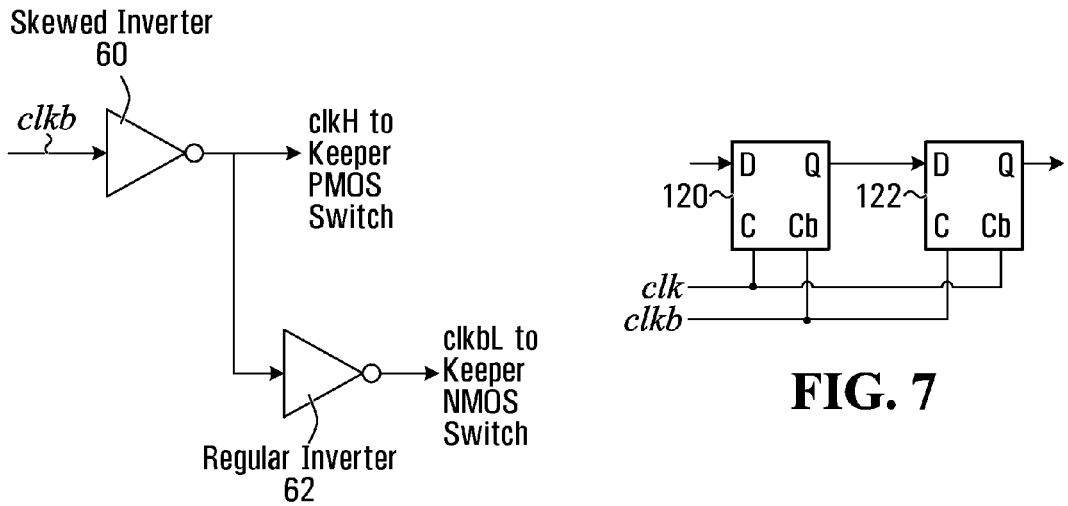
FIG. 6
FIG. 7
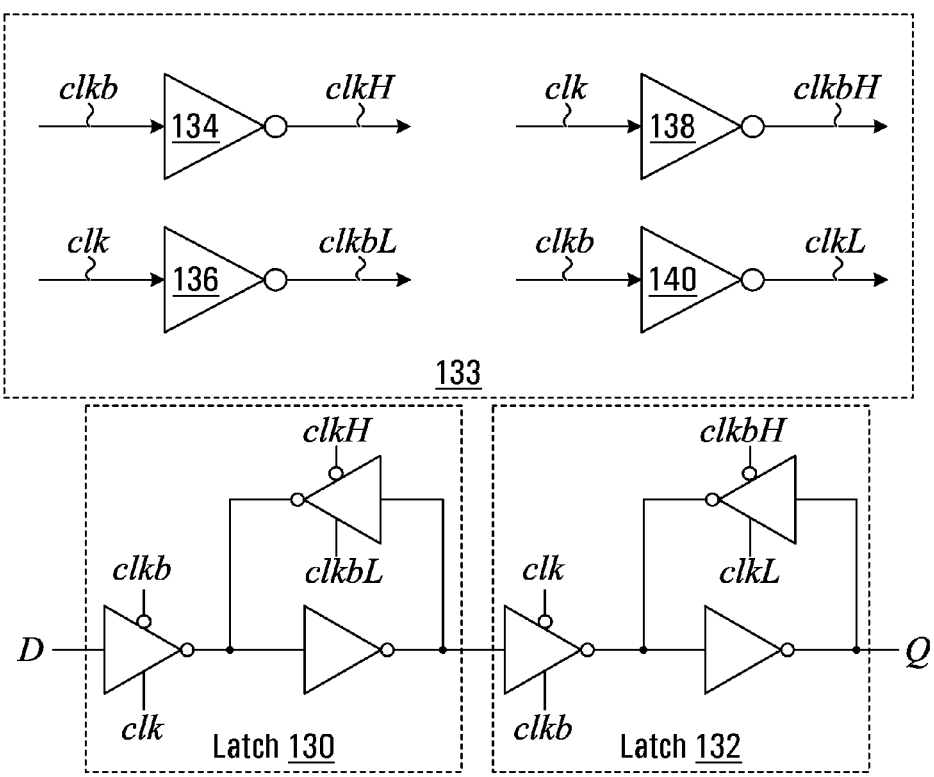
FIG. 8

DUAL MODE LATCH CIRCUIT

FIELD

The application relates to latch circuits. In particular, the present application provides a latch circuit and a method that are operable over a broad range of frequencies.

BACKGROUND

In electronics, a flip-flop or latch circuit is a circuit that has two stable states and can be used to store state information. The circuit can be made to change state by signals applied to one or more control inputs and will have one or two outputs. It is the basic storage element in sequential logic. Flip-flops and latch circuits are a fundamental building block of digital electronics systems used in computers, communications, and many other types of systems.

BRIEF DESCRIPTION OF THE DRAWINGS

Embodiments of the disclosure will now be described with reference to the attached drawings in which:

FIG. 4A is a simplified circuit diagram of an inverter with a strong P transistor and a weak N transistor;

FIG. 4B is a simplified circuit diagram of an inverter with a strong N transistor and a weak P transistor;

FIG. 6 is a simplified circuit diagram of a clock producer circuit in accordance with an embodiment of the invention;

FIG. 7 is a simplified block diagram of a an edge triggered flip-flop in accordance with an embodiment of the invention;

FIG. 8 is a simplified circuit diagram of a flip-flop in accordance with another embodiment of the invention;

DETAILED DESCRIPTION

In a conventional static CMOS latch circuit, keeper devices are used to maintain a value stored in the latch circuit when the latch circuit is not transparent. The keeper devices form a memory cell that maintains the value. When the latch circuit is transparent, the keeper devices are disengaged (controlled by the input clock signals) and the latch circuit replicates its data input. At a relatively low frequency, there are only two states, the transparent state and the latch circuit state. At a relatively high frequency, the clock signal cannot be considered to be a square-wave anymore. There will be a considerable amount of time when the clock is transitioning from LOW to HIGH or from HIGH to LOW. During the clock transition state, the keeper devices impede the transition of data from the latch circuit input to its output when the latch circuit first becomes transparent, and when the data input is updated right before the transparent state ends. In the static latch, the specific frequency above which at the keeper devices are no longer effective is a function of circuit design, and device dimensions.

A conventional dynamic latch circuit does not include keeper devices and has a higher operating frequency than the static latch circuit since contentions caused by the keeper devices during clock transitions do not exist. However, dynamic latch circuites would fail to operate at very low clock frequency. Therefore, a conventional dynamic latch circuit cannot be used when a wide operating frequency range is required. In the dynamic latch, the frequency below which such a dynamic latch would cease to be effective is a function of circuit design and device dimensions.

Embodiments of the invention provide a latch circuit that may be used in place of a conventional CMOS latch circuit by changing the data storage architecture in a manner that may provide a speed boost and/or power reduction. Applications that require the operation of a sequential logic latch circuit over a wide frequency range may benefit from this invention. A specific example is a serial interface operating at >28 Gbps where power and speed are being aggressively optimized.

Figure 1A:
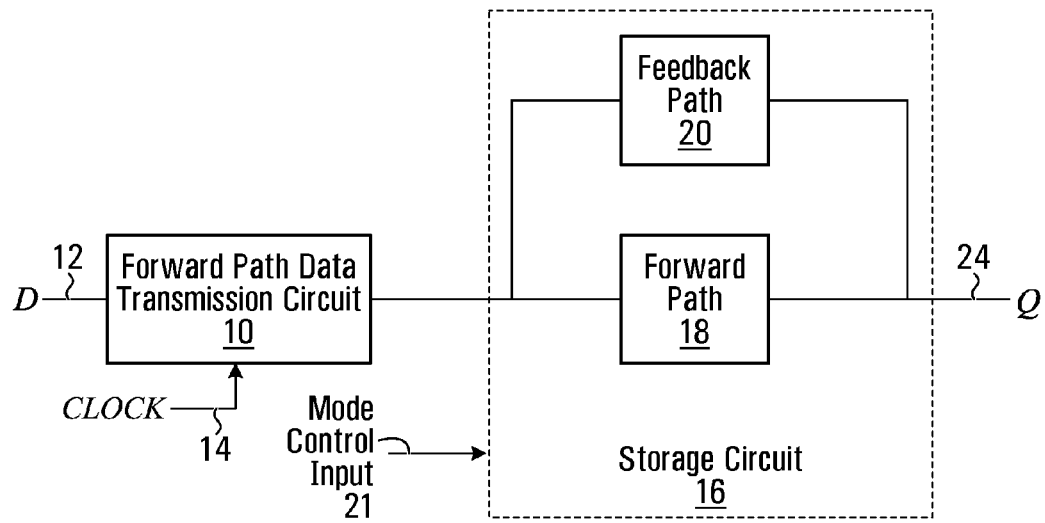
FIG. 1A is a simplified block diagram of a dual mode latch circuit in accordance with an embodiment of the invention.

Referring now FIG. 1A, shown is a block diagram of a latch circuit provided by an embodiment of the invention. Shown is a forward path data transmission circuit 10 having data input D 12. The output of the forward path data transmission circuit 10 is connected to the input of a storage circuit 16 which produces a Q output 24. The storage circuit 16 has a forward path 18 and a feedback path 20. The storage circuit 16 also has a mode control input 21 which controls whether the latch circuit as a whole is functioning in a first mode of operation or a second mode of operation. While in the first mode of operation, the latch circuit functions as a static latch circuit, and while in the second mode of operation, the circuit functions as a dynamic latch circuit.

Figure 2A:
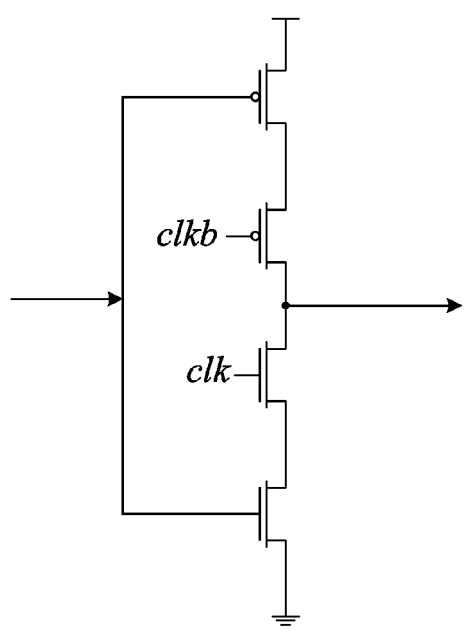
FIG. 2A is a simplified circuit diagram of a clocked inverter.
Figure 2B:
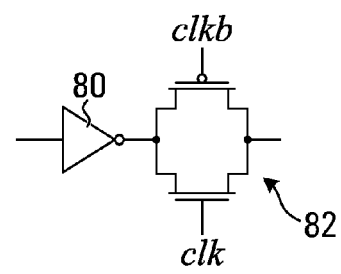
FIG. 2B is a simplified circuit diagram of an inverter in combination with a transmission gate.

In some embodiments, the forward path data transmission circuit 10 is a clocked inverter. In some embodiments, the forward path data transmission circuit 10 is an inverter in combination with a transmission gate. Similarly, in some embodiments, the feedback path 20 of the storage circuit 16 is a clocked inverter. In some embodiments, the feedback path 20 is an inverter in combination with the transmission gate. An example implementation of a clocked inverter is depicted in FIG. 2A. An example of an inverter in combination with a transmission gate is depicted in FIG. 2B which depicts inverter 80 and transmission gate 82. The circuits of both FIGS. 2A and 2B each include a clocked PMOS device and a clocked NMOS device.

In operation, mode control input 21 controls whether the latch circuit is in the first mode of operation or the second mode of operation. Examples of the mode control input are detailed below. While in the first mode of operation, the forward data path transmission circuit receives the clock 14 and the data input D 12, and produces a data output which is forwarded towards the storage circuit 16. The forward data path transmission circuit 10 has a transparent state activated by the clock during which the data input is reproduced as the data output. More specifically, so long as the clock input is high, the data input is reproduced as the data output. When the clock goes low, the data input is no longer reproduced as the data output. At this point, while in the first mode of operation (static latch circuit), the clock going low also activates the feedback path 20 in the storage circuit so that the value output by the forward data path transmission circuit 16 at the time the clock goes low is maintained in the storage circuit 16.

While in the second mode of operation, namely the mode in which the latch circuit functions as a dynamic latch circuit, the forward data path transmission circuit 10 functions the same as in the first mode of operation, but the feedback path 20 is inactive. In this mode, the latch circuit output is the data output of the forward path data transmission circuit 10 after passing through the forward path 18 of the storage circuit.

In some embodiments, there is a circuit that controls whether the storage circuit is in the first mode of operation or the second mode of operation, for example by generating the mode control input 21. Specific examples of such a circuit will be described below.

In a first example, the circuit that controls whether the storage circuit is in the first mode of operation or the second mode of operation is a frequency detector that determines a frequency of the clock input and causes the storage circuit to be in the first mode of operation or the second mode of operation based on the determined frequency, for example by enabling or disabling the feedback path. For example, the frequency detector may cause the storage circuit to be in the first mode of operation when the frequency is below a threshold frequency and cause the storage circuit to be in the second mode of operation when the frequency is above a threshold frequency. In this way, the circuit functions as a static latch circuit for lower operating frequencies, and as a dynamic latch circuit for higher operating frequencies. It is noted that the two thresholds do not need to be the same.

In another embodiment, the circuit that controls whether the storage circuit is in the first mode of operation or the second mode of operation receives a control input, and controls whether the storage circuit is in the first mode of operation or the second mode of operation based on the control input. This control input might be generated elsewhere based on the operating frequency of the circuit. The circuit may for example disconnect the feedback path 20 from the storage circuit to cause the storage circuit to be in the second mode of operation.

Figure 1B:
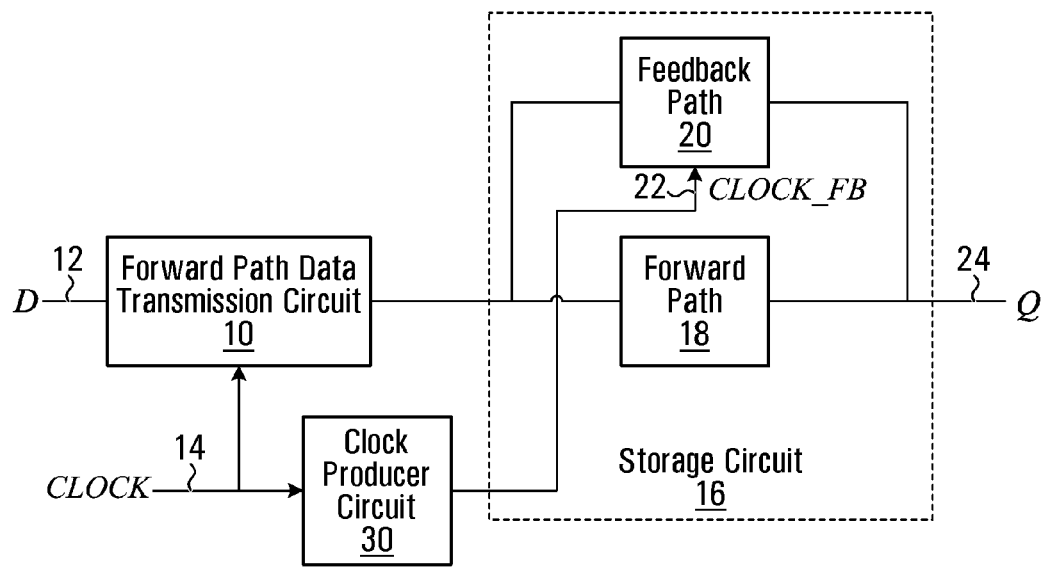
FIG. 1B is a simplified block diagram of another dual mode latch circuit in accordance with an embodiment of the invention.

In another embodiment, the circuit that controls whether the storage circuit is in the first mode of operation or the second mode of operation is a clock producer circuit. This embodiment is depicted in FIG. 1B which is similar to FIG. 1A, but also includes a clock producer circuit 30 shown connected to receive the clock input 14 and to produce a clock output 22 which is input to the feedback path 20. In FIG. 1B, the clock input 22 to the feedback path 20 from clock producer circuit 30 is specific example of a mode control input.

The clock output 22 is a clock signal clock_FB which is generated by the clock producer circuit 30 based on the clock input 14. The clock producer circuit produces clock signal clock_FB specifically for controlling the storage circuit such that:

during the first mode of operation, the clock input to the storage circuit includes transitions that cause the feedback path to function;

during the second mode of operation, the clock input to the storage circuit does not include transitions that cause the feedback path to function, and the clock input to the storage circuit has a state that causes the feedback path to be inactive.

Figure 3A:
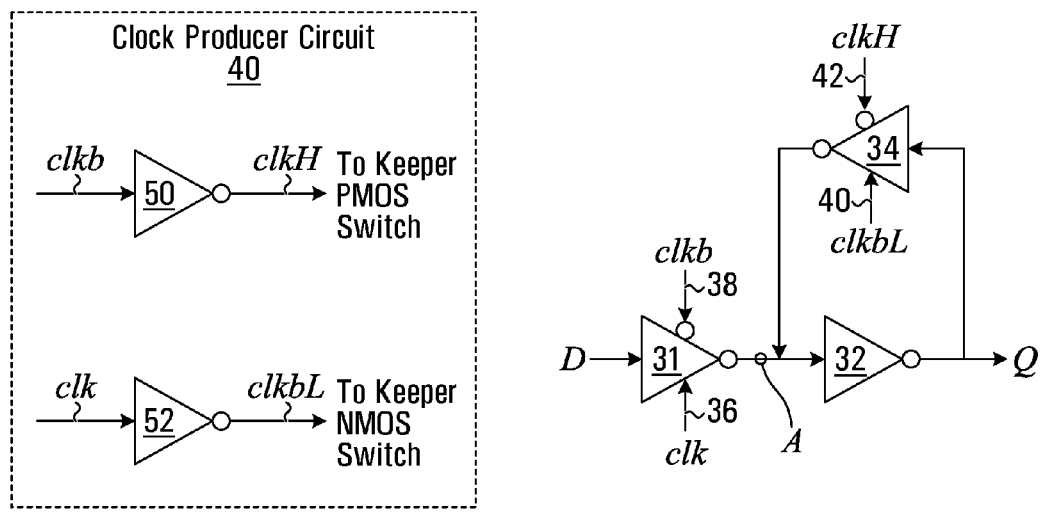
FIG. 3A is a simplified circuit diagram of a dual mode latch circuit in accordance with an embodiment of the invention.

FIG. 3A shows a specific example of the latch circuit of FIG. 1B. With this embodiment, the forward path data transmission circuit is a clocked inverter 31. The forward path of the storage circuit is inverter 32, and the feedback path of the storage circuit is a clocked inverter 34. As before, an inverter and transmission gate can be used in place of a clocked inverter. In either case, the feedback path typically includes a clocked PMOS device and a clocked NMOS device.

Figure 3B:
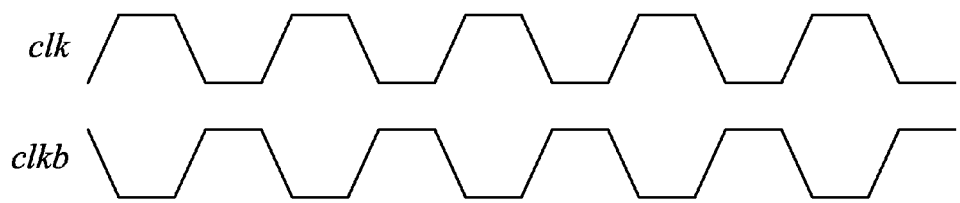
FIG. 3B is a plot of complementary clock signals.

Internally, a latch circuit such as depicted in FIG. 3A requires two clocks that are anti-phase, as shown in FIG. 3B. These are referred to as clk and clkb (short for clock bar). There are two options for building a latch circuit. In a first option, there can be two clock inputs for the latch circuit, one for each one of these two required clocks. In a second option, there is just one input clock, with the other clock being created internally, using an inverter (a regular inverter). Both of these options are contemplated for the embodiments described herein.

Focusing on the feedback path, in a conventional CMOS latch circuit, one of these two clocks clk, clkb controls the clocked PMOS device and the other controls the clocked NMOS device. In contrast, with the embodiment of FIG. 3A, clock producer circuit 40 produces clocks specifically for controlling the clocked PMOS and NMOS devices in the feedback path.

The clocked inverter 31 receives clock signals clk 36 and clkb 38. For a circuit that responds to rising transitions of the clock signal clk, the clock signals are also processed by the clock producer circuit 40 to produce clkH 42 and clkbL 40 both of which are input to the clocked inverter 34 in the feedback path. For example, clkH is input to a PMOS transistor in the clocked inverter 34, and clkbL is input to an NMOS transistor in the clocked inverter 34.

FIG. 3A also shows a specific implementation of the clock producer circuit 40. The clock producer 40 has a first inverter 50 constructed of a weak N transistor and a strong P transistor for processing an inverted version of the input clock clkb to produce clkH.

There is a second inverter 52 having a weak P transistor and a strong N transistor for processing the clock input clk and producing clkbL.

In FIG. 3A, the overall output of the latch circuit is node Q. Node A is an internal node to the latch circuit. The latch circuit output at node Q is directly defined by the value of node A. So, if something changes node A, it indirectly causes the latch circuit output to change.

The state of node A is defined by the clocked inverter 31 when the latch circuit is transparent (clk is HIGH). In that case, the clocked inverter 34 in the storage circuit is not active.

The state of node A is defined by the clocked inverter 34 in the storage circuit when the latch circuit is latch circuited (clk is LOW). In that case, the clocked inverter 31 is not active.

While the clock is in transition between the two phases, both clocked inverters 31 and 34 try to control node A. This is a contention unless both try to set A to the same value. But, this does not always happen.

Neither clocked inverter 31, 34 directly defines the latch circuit output. They directly define the value on node A. Which one defines the value of node A depends on the clock value. Node A then defines the latch circuit output value through the inverter 32.

As noted above, for a latch circuit that is active when clk is high, two new clock signals are produced by the clock producer circuit. These include clkbL, clkH. Clocked NMOS devices in the feedback path are driven by clkbL, and clocked PMOS devices in the feedback path are driven by clkH.

For a latch circuit that is active when clock is low (i.e. when clkb is high, two new clock signals are produced by the clock producer circuit. These include clkbH and clkL. Clocked NMOS devices in the feedback path are driven by clkL, and clocked PMOS devices in the feedback path are driven by clkbH.

At very high frequency, clkL and clkbL are effectively DC voltages at LOW logic, and clkH and clkbH are effectively DC voltages at HIGH logic. Therefore, at very high frequency, the clocked devices in the feedback path never turn on, and the latch circuit behaves as if it was a dynamic latch circuit.

At very low frequency, clkL and clkH become substantially identical to clk, and clkbL and clkbH become substantially identical to clkb. Therefore, at very low frequency, the keeper devices engage, and the latch circuit behaves as if it was a static latch circuit.

The result is that the latch circuit is a dynamic latch circuit at high frequency providing speed, while it remains operational as a static latch circuit at low frequency. The respective ranges of frequencies over which the latch circuit functions as a dynamic latch circuit as opposed to a static latch circuit are affected by the degree of intentional mismatch introduced in the clock producer circuit. For clock frequencies that result in the outputs of inverters 50 and 52 becoming DC HIGH and DC LOW respectively, the latch circuit behaves as a dynamic latch circuit. For frequencies that result in the outputs of inverters 50 and 52 continuing to have transitions producing rail-to-rail clocks, the latch circuit behaves as a static latch circuit.

FIG. 4A shows an example implementation of inverter 50 of FIG. 3A. Shown is an inverter with a strong P transistor and a weak N transistor.

FIG. 4B shows an example implementation of inverter 52 of FIG. 3A. Shown is an inverter with weak P transistor 74 and strong N transistor 76.

In some embodiments, the desired behaviour of the clock producer circuit is achieved by selection of the size (transistor width and/or transistor length) of transistors, for example the NMOS and PMOS transistors of FIGS. 4A and 4B. In some embodiments, this is achieved through selection of transistor type used for a given semiconductor technology. For example, the technology may provide transistor types that offer different transconductance due to the physical characteristics of the materials used to manufacture them. Alternatively, this is achieved by a combination of size and transistor type.

In FIGS. 4A and 4B, the relative and absolute sizes of the PMOS and NMOS transistors define the behaviour of the clock producer circuit. Referring to FIG. 4A, for example, there are two paths through the circuit, namely one through the PMOS transistor 70, and one through the NMOS transistor 72. These two paths behave like two low pass filters. Each transistor has a resistance that is for the most part a function of the size of the transistor, and also has a parasitic capacitance. The resistance and capacitance together define the behaviour of the lowpass filter. For a more or less fixed parasitic capacitance, the passband of the lowpass filter is mainly dictated by the resistance, which in turn is dictated by the size of the transistor. A larger transistor will have a higher cutoff frequency than a smaller transistor. A design input is a low frequency, or low range of frequencies for which the storage circuit is to be enabled, and a high frequency or high range of frequencies for which the storage circuit is to disabled.

To enable low frequency operation: at lower frequencies, namely the range where the storage circuit is expected to be active, the clock needs to be able to pass through both transistors. This can be achieved by ensuring the passband of the two transistors includes the desired lower frequency/range. It is noted that even if this condition is satisfied, if the larger transistor is too much larger than the smaller transistor, it may overpower the smaller transistor. This may place an upper limit on the size of the larger transistor.

To enable high frequency operation: at high frequencies, namely the range where the storage circuit is expected to be inactive, the smaller transistor needs to be filtering out the clock. Thus, the cutoff frequency of the smaller transistor needs to be below the high frequency/range at which the clock to the storage circuit is to be disabled. To ensure that the output is always high, the passband of the larger transistor should include the high frequency/range.

The behaviour of the circuit of FIG. 4A will now be described by way of example with reference to FIGS. 5A through 5E which show example simulation results. For these results, the PMOS device in FIG. 4A has one finger and one fin. This is a FinFET technology. The number of fins affects the effective width of a transistor. All gate lengths are 16 nm. The NMOS device in FIG. 4A is made of up of 6 transistors in series. Each having one fin and one finger. So, this can be thought of as a single transistor with a gate length of 16×6=96 nm. An important parameter to describe the size of a transistor is the ratio of its width to its length (W/L). In this description, a transistor with a greater W/L ratio is a "bigger" transistor. For this example, the PMOS in FIG. 4A has a greater W/L compared to the NMOS in FIG. 4A because the NMOS has a greater length. The device type for the NMOS and PMOS transistors is SVT (standard Vt). The forward path devices, in the latch circuit, are ULVT. ULVT stands for Ultra Low Vt. ULVT devices are faster than SVT devices. These device parameters and selections provide a specific example of devices that can be used to achieve a certain frequency response (described below). The actual device parameters and selections can vary on an implementation specific basis.

Figure 5A:
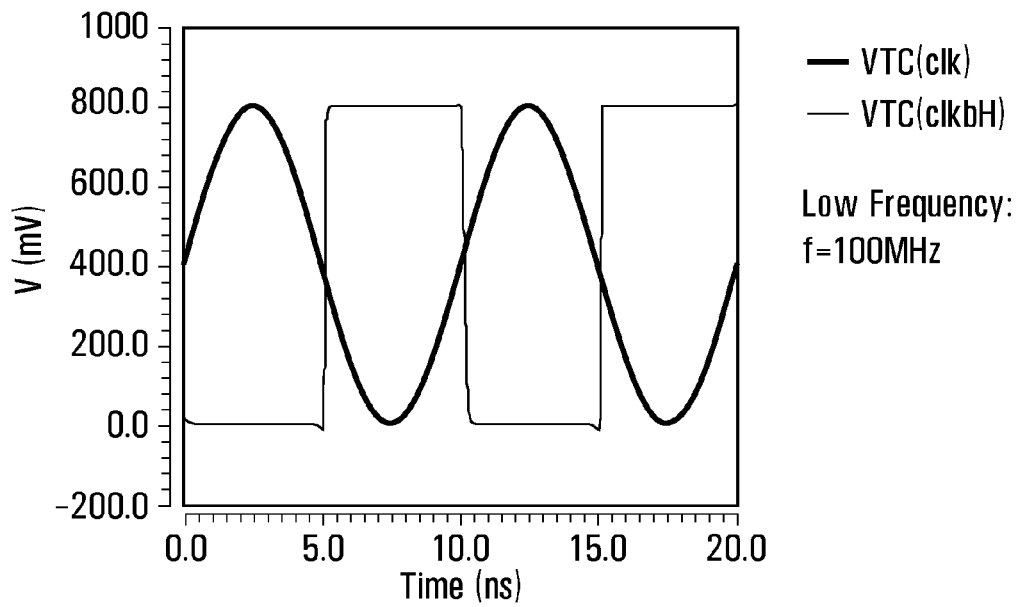
FIGS. 5A through 5J show example simulated $V_{out}$ vs. $V_{in}$ characteristics for the inverters of FIGS. 4A and 4B.
Figure 5B:
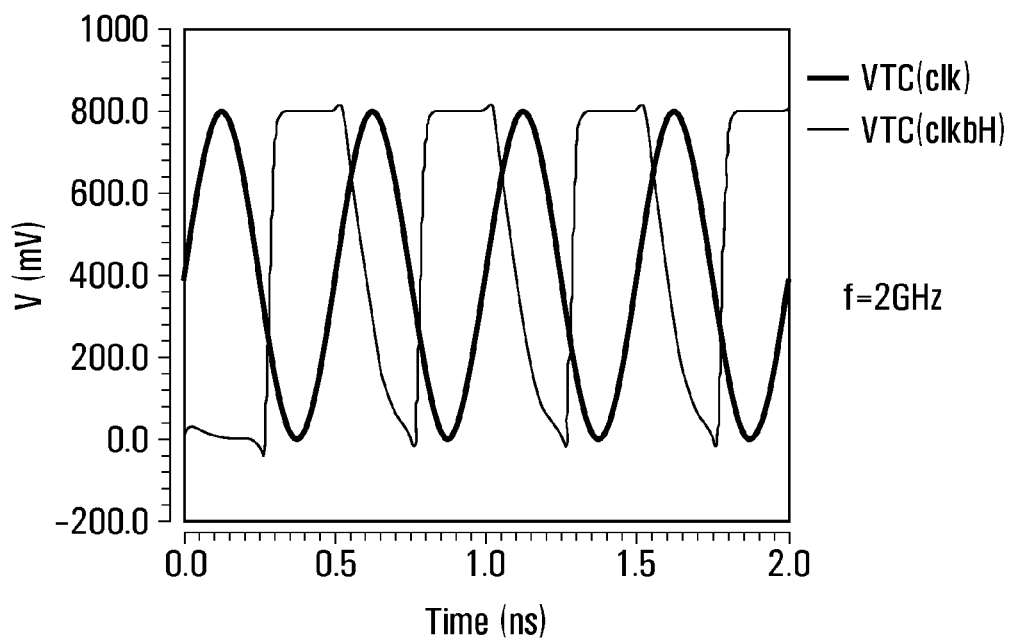
Figure 5C:
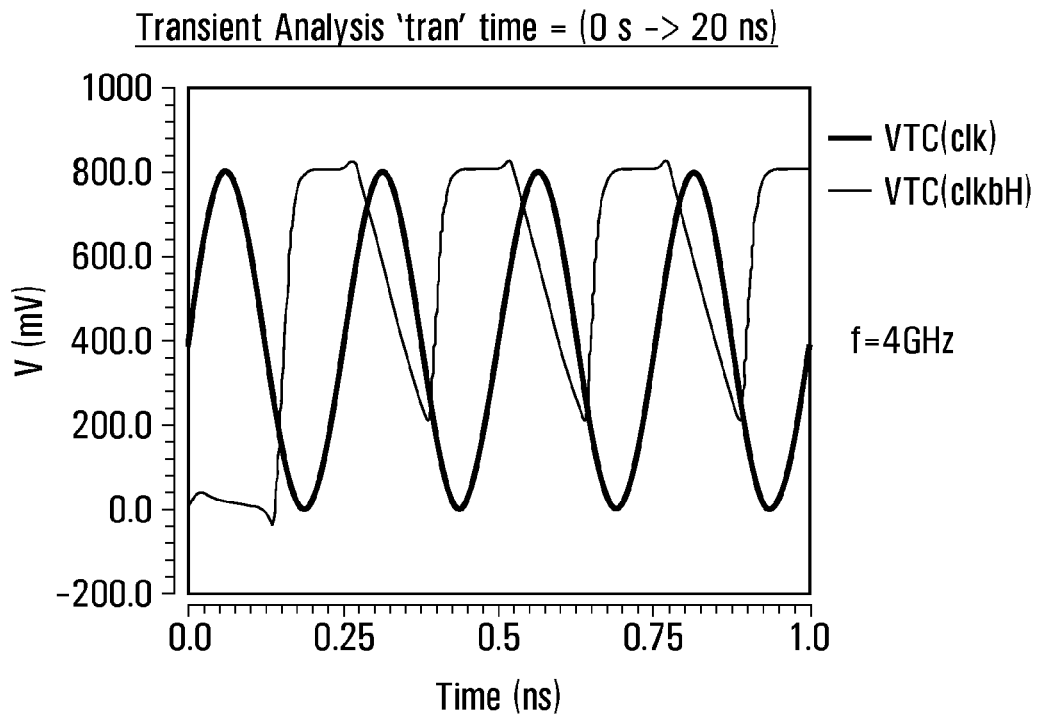
Figure 5D:
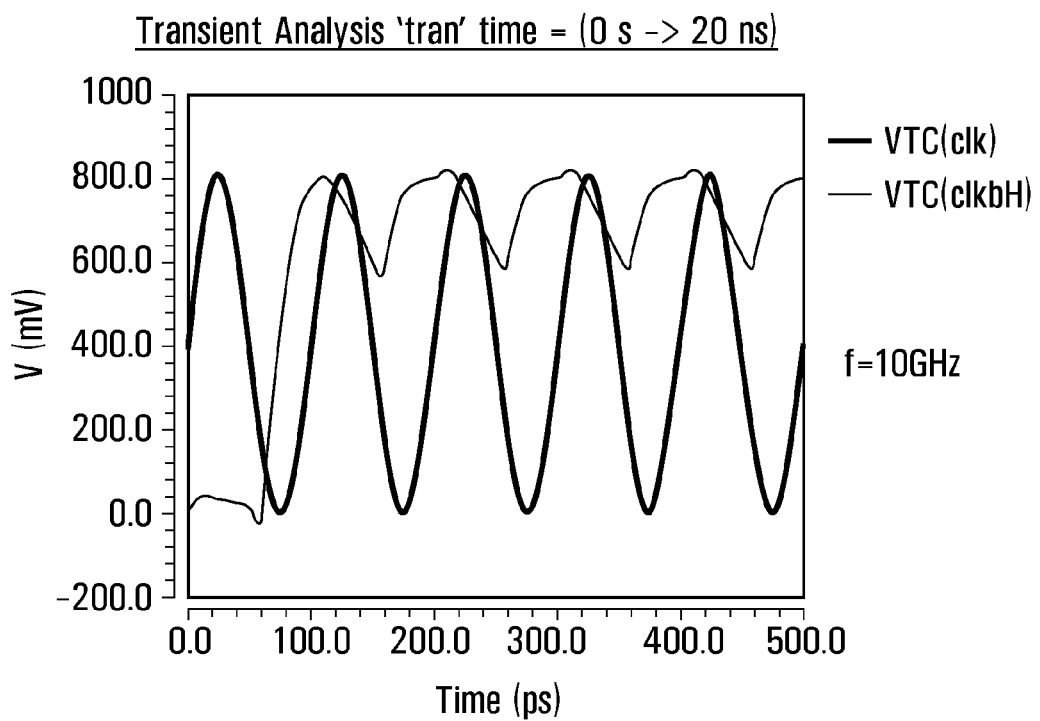
Figure 5E:
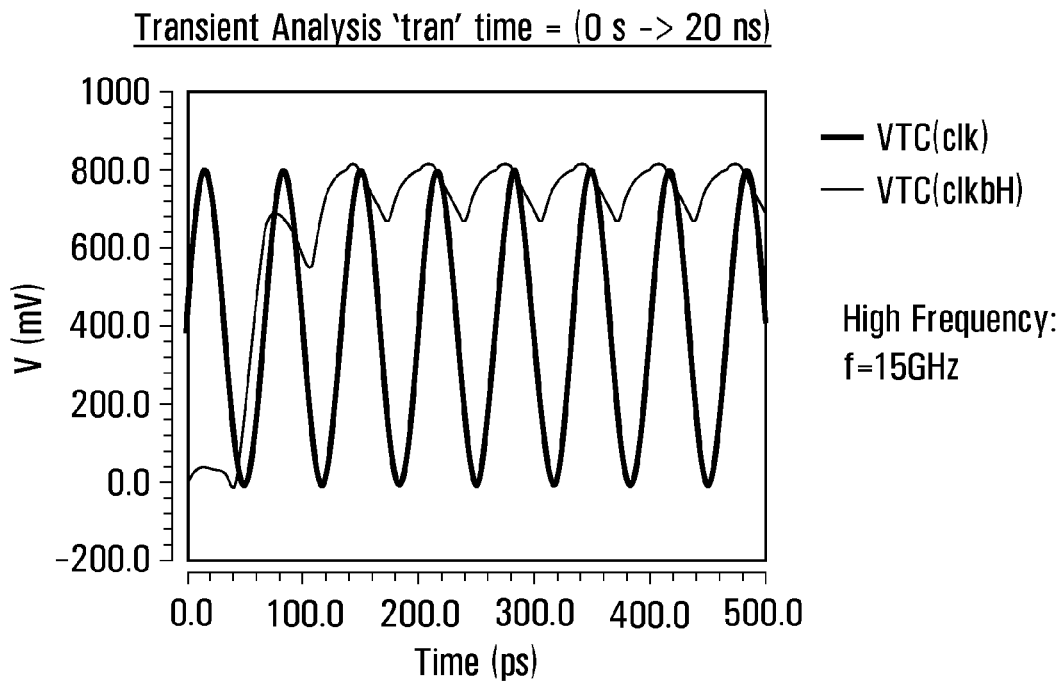
Figure 5F:
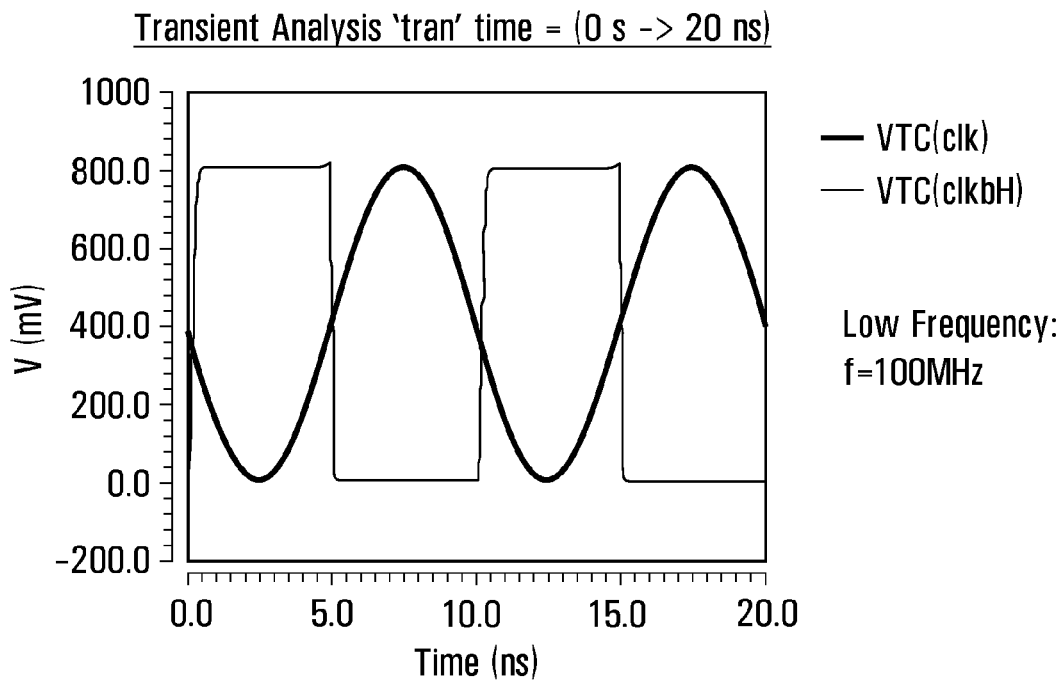
Figure 5G:
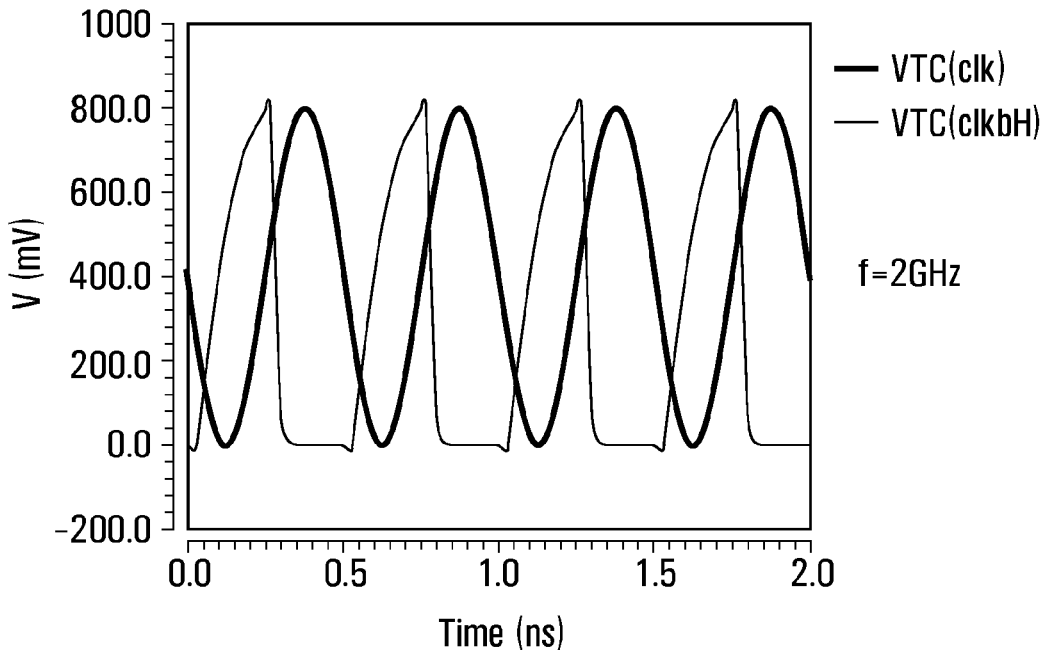
Figure 5H:
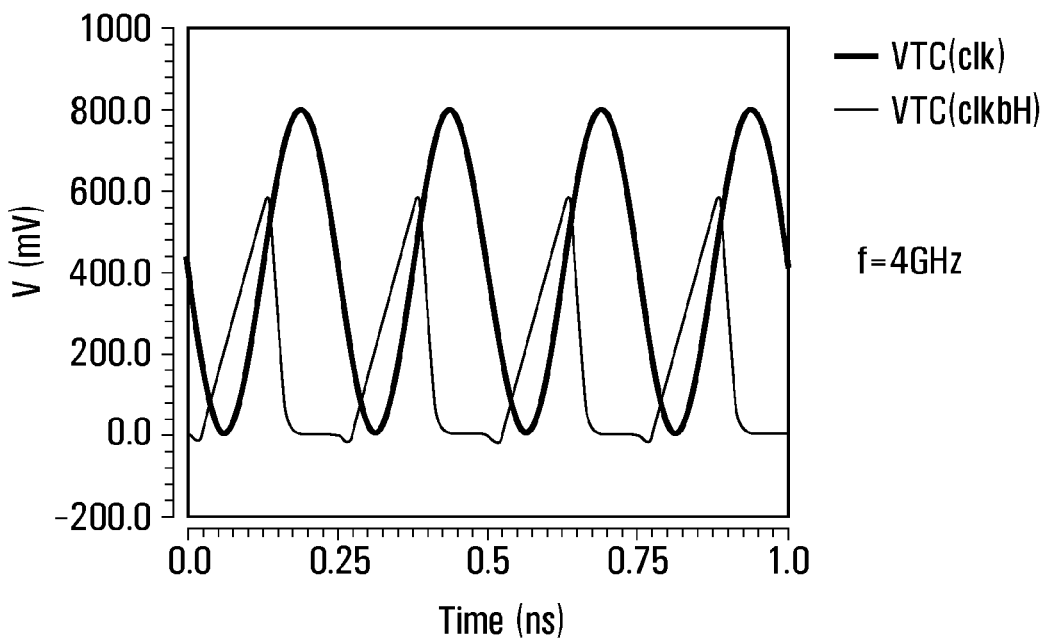
Figure 5I:
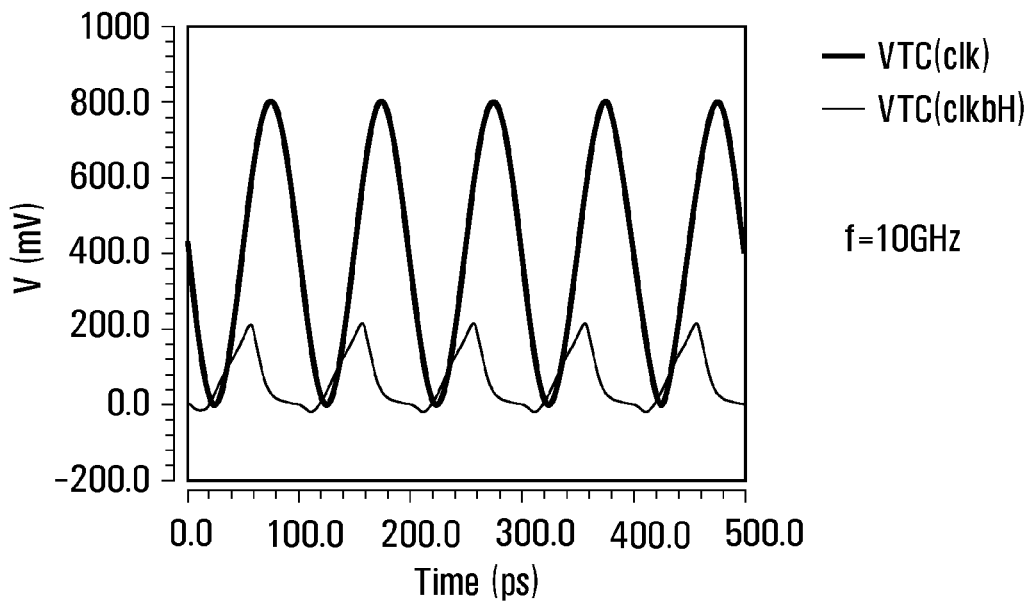
Figure 5J:
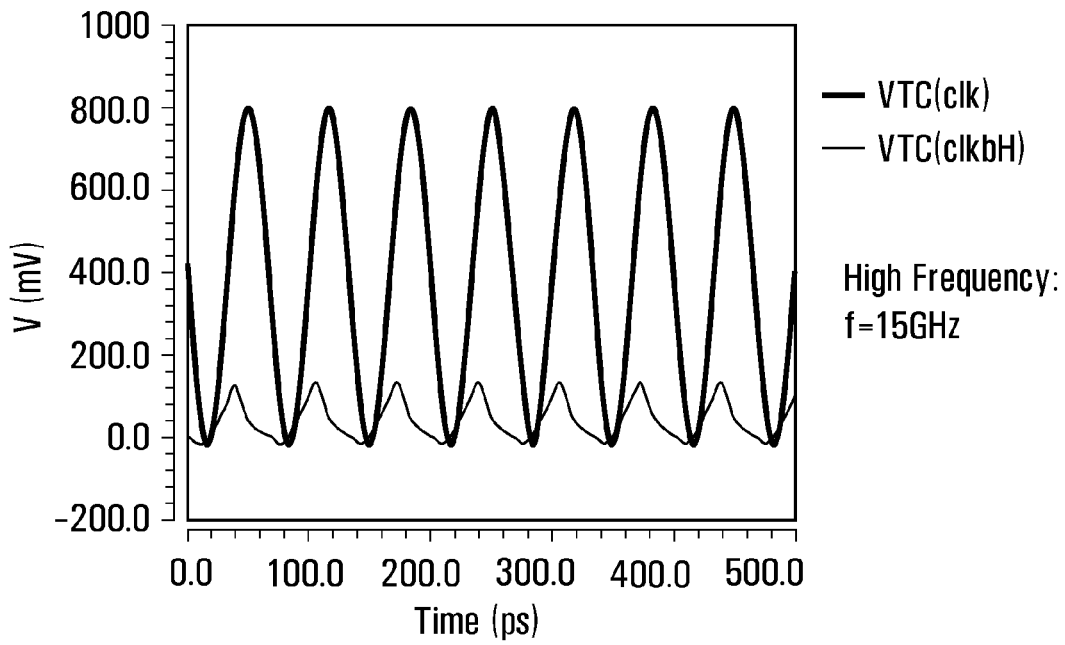

Each of FIGS. 5A to 5E depict the output voltage of the clock producer circuit of FIG. 4A versus input voltage. In FIG. 5A, the clock frequency is 100 Mhz, which is in the passband of both transistors, and as such, the clock passes through the clock producer circuit. In FIG. 5B, the clock frequency is 2 GHz. The clock still passes through and would cause the storage circuit to function. In FIG. 5C, the clock frequency is 4 GHz. The clock is starting to stay high, but the processed clock still dips down to 200 mV which is sufficient to cause the storage circuit to function. In FIG. 5D, the clock frequency is 10 GHz. Now the processed clock only goes slightly below 600 mV which will not be sufficient for the storage circuit to function. Finally, in FIG. 5E, the clock frequency is 15 GHz, and the processed clock stays above 600 mV which is not sufficient for the storage circuit to function.

Similar simulation results for the circuit of FIG. 4B are depicted in FIGS. 5F through 5J. For these simulation results, the PMOS device in FIG. 4B is the same size as the NMOS device in FIG. 4A, and the NMOS device in FIG. 4B is the same size as the PMOs device in FIG. 4A.

FIG. 6 shows another example of a clock producer circuit which can be used as an alternative to the circuit 40 of FIG.

3A. In this example, inverter 60 is the same as inverter 50, and is composed of a weak N transistor and a strong P transistor. The output of this inverter clkH is then fed through a regular inverter 62 to produce clkbL. A similar circuit could be implemented using an inverter with a strong N transistor and a weak P transistor (driven by clk) in combination with a regular inverter to produce clkbH and clkL.

Referring now to FIG. 7, shown is flip-flop circuit provided by an embodiment of the invention. The circuit has a first latch circuit 120 and a second latch circuit 122. Both of these latch circuits are implemented in accordance with one of the previously described latch circuit embodiments. In a specific example, each of the latch circuits 120, 122 has its own clock producer circuit but latch circuit 120 (including its clock generation circuit) is driven by clk, clkb, whereas latch circuit 122, including its clock producer circuit, is driven by reversed clock inputs clkb, clk. For example, the two latch circuits may be implemented using the circuitry of FIG. 3A, including clock producer circuit 40.

Referring now to FIG. 8, shown is a circuit of another flip-flop provided by an embodiment of the invention. The flip-flop includes a first latch circuit 130 and a second latch circuit 132 connected together in sequence, and a clock producer circuit 133. More generally, each of these latch circuits may be implemented in accordance with the circuit of FIG. 1A, 1B, 3A or 3B. The clock producer circuit 133 includes a first inverter 134 with a strong P transistor and a weak N transistor. This receives clkb and produces clkH. A second inverter 136 has a weak P transistor and a strong N transistor, and receives clk and produces clkbL. A third inverter 138 has a strong P transistor and a weak N transistor. This receives clk and produces clkbH. Finally, shown is a fourth inverter 140 which has a weak P transistor and a strong N transistor and receives clkb and produces clkL. The storage circuit of latch circuit 130 receives clkH and clkbL whereas the storage circuit of 132 receives clkbH and clkL. Once again, inverters 136 and 140 could be replaced with conventional inverters that invert the outputs of inventers 134 and 138.

Figure 9:
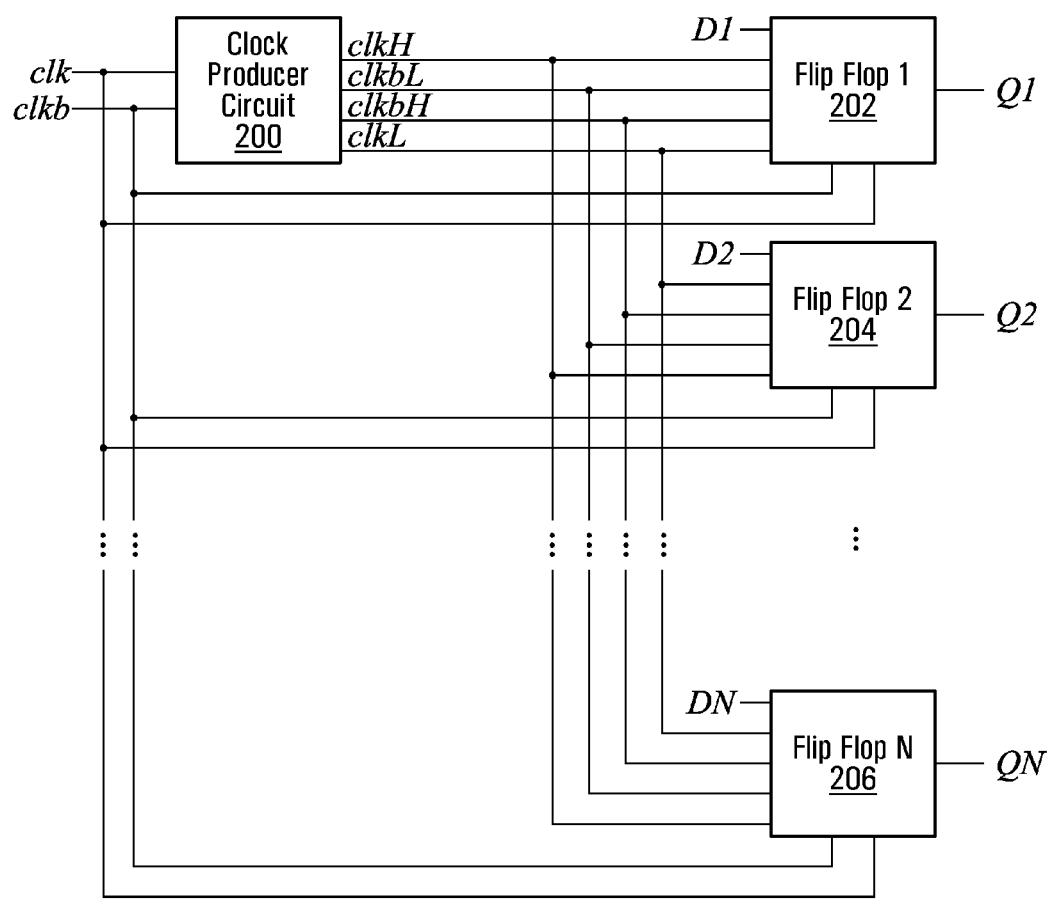
FIG. 9 is a simplified block diagram of a set of flip-flops in accordance with another embodiment of the invention.

Referring to FIG. 9, now shown is a set of flip-flops 202, 204, . . . , 206 that receive respective data inputs D1, D2, . . . , DN and produce respective data outputs Q1, Q2, . . . , QN. Shown is a common clock producer circuit 200 which receives clk and clkb inputs and produces the four clock outputs clkH, clkbL, clkbH and clkL. All of these four clock inputs are used to drive the storage circuits in each of the flip-flops to 202, 204, . . . , 206. Specifically, they can be connected to the various flip-flops as described for the embodiment of FIG. 8. In addition, the flip-flops each receive the clk and clkb signals. It can be seen that with the embodiment of FIG. 9, the inverters 134, 136, 138, 140 of FIG. 8 are instantiated once to develop the internal clock signals for the entire set of flip-flops. This provides for a more efficient design than replicating the inverters in each of the flip-flops.

In some embodiments, if the method described in the patent is followed correctly, the resulting latch will not have a minimum operating frequency. Rather, at frequencies down to 0, the latch will function as if it was a static latch. However, typically, the maximum operating frequency will be higher than that of a conventional static latch made in the same semiconductor technology. So, the frequency range is from DC (zero) to the maximum operating frequency of the latch.

This is independent of the semiconductor technology. In other words, this can be done in any semiconductor technology. However, the maximum operating frequency of the latch may be dictated by the given semiconductor technology.

In a specific example, the latch is in the first mode of operation (static, or rail-to-rail clock signals to the keepers) for the frequency range from 0 to 4 GHz. It is to be emphasized however, that this range is technology specific, and is also a function of the size of the transistors. The latch is in the second mode of operation (dynamic, or low-swing clock signals with an average voltage less than the threshold to the keepers) for the frequency range of 4 GHz and above.

However, it should be noted that in some implementations, even though the latch continues to receive a rail-to-rail clock at its keepers up to 4 GHz, it will not fail even if its keepers receive a clock only up to a lower frequency, for example 2 GHz. The latch absolutely needs a clock for its keepers if the frequency is below the lower frequency, 2 GHz in this example. The fact that the keepers receive a clock even up to 4 GHz is a guarantee that there will never be a range of frequencies, between the two modes, where the latch would fail. In other words, this guarantees that the latch will have a continuous operating frequency range from 0 up to its maximum operating frequency of, for example 15 GHz.

Figure 10:
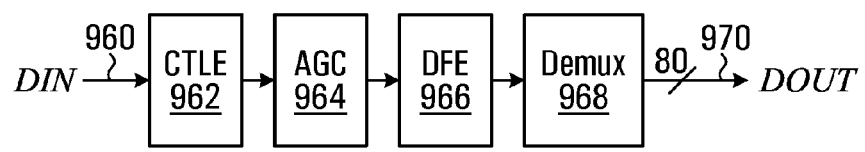
FIG. 10 is a simplified block diagram of a SerDes receiver.

Referring now to FIG. 10, shown is a simplified block diagram of a SerDes (serializer/deserializer) receiver path provided by an embodiment of the invention. A SerDes is a pair of functional blocks (transmitter and receiver) commonly used in high speed communications to compensate for limited input/output, or to convert a high speed serial signal to a slower speed parallel circuit for digital processing. These blocks convert data between serial data and parallel interfaces in each direction. The term "SerDes" generically refers to interfaces used in various technologies and applications. The primary use of a SerDes is to provide data transmission over a single/differential line in order to reduce the number of I/O pins and interconnects compared to a parallel interconnection.

The receiver path depicted in FIG. 10 includes a DIN (data input) 960, CTLE (continuous time linear equalizer) 962, AGC: (automatic gain control) 964, DFE (decision feedback amplifier) 966, Demux (demultiplexer) 962, and DOUT (data output) 970. DOUT 970 may, for example have an 80 bit bus width, but other widths are possible. The receiver path takes a received serial input and converts it to a parallel output.

The demultiplexer of FIG. 10 is implemented using, in part, a dual mode latch circuit according to one of the embodiments described above.

Figure 11:
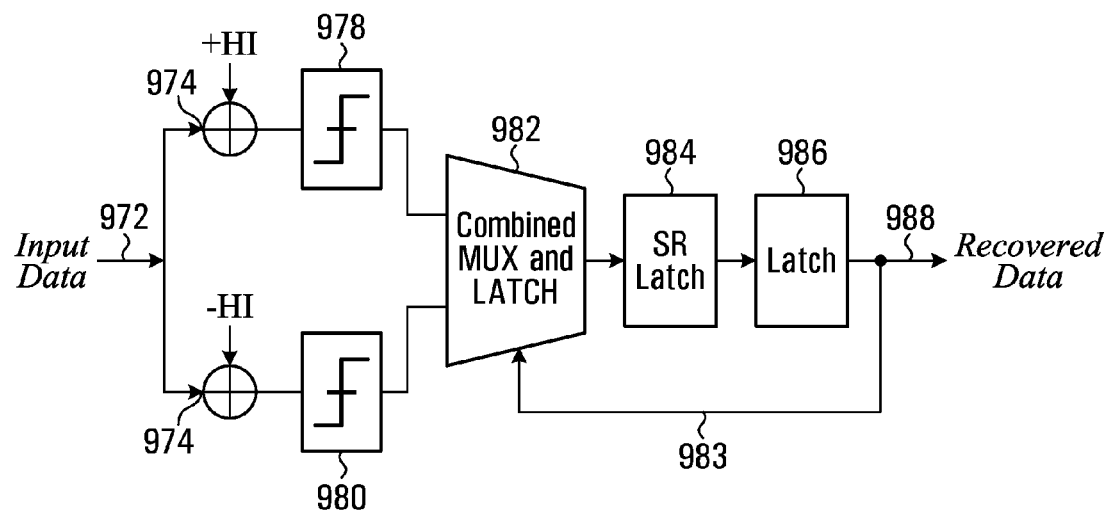
FIG. 11 is a simplified block diagram of a single tap unrolled DFE (decision feedback equalizer)

FIG. 11 is a simplified block diagram of a DFE that is used in a receiver block of a SerDes in some embodiments, and, for example, can be used as DFE 966 in the SerDes receiver of FIG. 10. This particular example is a single tap unrolled DFE.

The DFE has an input 972 connected to tap 974. The outputs of tap 974 are input to a respective slicer 978,980. The output of the two slicers 978,980 is input to a combined multiplexer and latch 982 having a select input 983. The output of the combined multiplexer and latch 982 is connected to an SR latch 984 which in turn is connected to a latch 986. The output of the latch is the recovered data output 988, and this is also fed back as select input 983 to the combined multiplexer and latch 982.

In operation, weights of +H1 and −H1 are added to the input using tap 974 and both potential solutions are sliced/latched with slicers 978,980. The combined multiplexer and latch 982 that follows chooses either the +H1 or −H1 solution based on the previous solution (it decides the current bit's solution based on whether the previous bit was a 1 or 0).

Figure 12:
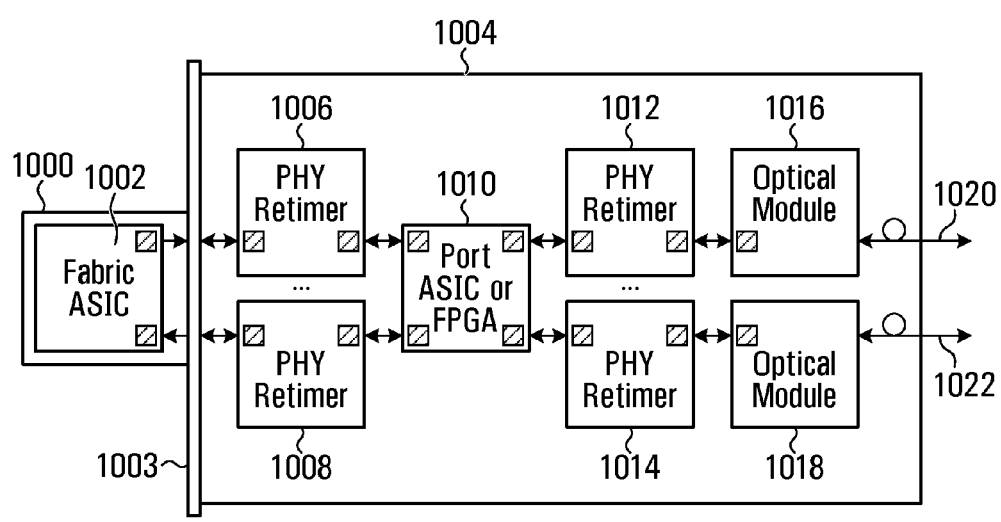
FIG. 12 is a simplified block diagram of a system employing 25G NRZ technology.

Referring now to FIG. 12 shown is a simplified block diagram of an example system using 25G NRZ technology, that employs SerDes functionality, such as described with reference to FIG. 10, and including the use of the DFE of FIG. 11. Shown is a first circuit board 1000 connected to a second circuit board 1004, for example through a backplane or long board trace. The first circuit board 1002 includes fabric ASIC 1000. The second circuit board 1004 includes a first PHY retimer 1006 connected to the fabric ASIC 1002, and also to port ASIC or FPGA 1010 which is then connected in sequence to PHY retimer 1012 and optical module 1016 which has an optical output 1020. Interconnections between components 1002,1006,1010,1012,1016 are all serial interconnections. PHY retimer 1008, port ASIC or FPGA, PHY retimer 1014 and optical module 1018 having optical output 1022 are interconnected in a similar manner. In operation, the fabric ASIC 1002 may for example, receive data from several different port devices. Using information in the data, the device will route data to the appropriate destination port. The PHY retimers 1006,1008,1012,1014 clean up data signals after transmission over the backplane or long board trace, or more generally any channel that introduces degradation. The port ASIC or FPGA reads data traversing through the device for the purpose of analyzing, capturing, or modifying the data before it is output. The optical module 1016 is an interface between optical signaling and electrical signaling. Typically, the fabric ASIC 1002, PHY retimers 1006,1008,1012,1014, port ASIC or FPGA 1010 are each a respective integrated circuit that is mounted to a circuit board. Each optical module 1016,1018 might include a number of integrated circuits, with each module as a whole plugged into circuit board 1004.

The system shows a number of blocks 124 which implement SerDes functionality, such as that of FIGS. 10 and 11, but more generally, which makes use of the combined multiplexer and latch functionality described previously. While the example shows such SerDes functionality being employed in numerous different locations, more generally in one embodiment, the SerDes functionality is used for at least one serial to parallel interface.

The SerDes blocks 124 convert the serial I/Os to/from parallel signals employed by digital circuitry within, for example, the PHY retimers, port ASIC or FPGA, Fabric ASIC or optical modules.

Another embodiment of the invention provides an integrated circuit with one or more SerDes blocks that convert serial I/Os to parallel signals; digital circuitry that operates on the parallel signals. A PHY retimer, port ASIC or FPGA or fabric ASIC are specific examples of such integrated circuits. It should be understood that the SerDes blocks might be implemented as in FIG. 10, but this is not necessarily the case. More generally, whatever the implementation is, the SerDes blocks make use of the combined multiplexer and latch functionality described above.

In an example, the present techniques can be used for regulating memory devices (e.g., DDR 4 SDRAM devices, DDR4 register devices, DDR4 controller devices), and other high speed data applications. Additionally, such techniques can be used for a variety of applications such as network and/or computer storage systems, computer servers, hand held computing devices, portable computing devices, computer systems, network appliances and/or switches, routers, and gateways, and the like.

Numerous modifications and variations of the present disclosure are possible in light of the above teachings. It is therefore to be understood that within the scope of the appended claims, the disclosure may be practiced otherwise than as specifically described herein.

The invention claimed is:

1. A latch circuit having a first mode of operation in which the latch circuit functions as a static latch circuit, and having a second mode of operation in which the latch circuit functions as a dynamic latch circuit;
   the latch circuit having inputs for receiving a latch circuit clock input and a data input and having an output for producing a latch circuit output, the latch circuit comprising:
   a forward data path transmission circuit connected to receive the latch circuit clock input and the data input, the forward data path transmission circuit producing a data output, the forward data path transmission circuit having a transparent state activated by the clock input during which the data input is produced as the data output;
   a storage circuit connected to receive the data output, the storage circuit having a forward path and a feedback path, the storage circuit having a clock input and producing the latch circuit output;
   wherein during the first mode of operation the feedback path is active, and based on the clock input of the storage circuit, the storage circuit maintains a value output by the forward data path transmission circuit as part of the data output, such that the latch circuit functions as a static latch circuit; and
   during the second mode of operation, the feedback path is inactive, and the latch circuit output is the data output after passing through the forward path of the storage circuit, such that the latch circuit functions as a dynamic latch circuit.

2. The latch circuit of claim 1 configured to adjust being in the first mode of operation or the second mode of operation based on a frequency of an input clock.

3. The latch circuit of claim 1 further comprising a circuit that controls whether the storage circuit is in the first mode of operation or the second mode of operation.

4. The latch circuit of claim 3 wherein the circuit that controls whether the storage circuit is in the first mode of operation or the second mode of operation comprises:
   a frequency detector that determines a frequency of the clock input, and causes the storage circuit to be in the first mode of operation or the second mode of operation based on the determined frequency.

5. The latch circuit of claim 4 wherein the frequency detector causes the storage circuit to be in the first mode of operation when the frequency is below a threshold frequency and causes the storage circuit to be in the second mode of operation when the frequency is above a threshold frequency.

6. The latch circuit of claim 3 wherein the circuit that controls whether the storage circuit is in the first mode of operation or the second mode of operation comprises:
   a clock producer circuit that receives the clock input of the latch circuit and produces the clock input to the storage circuit such that during the first mode of operation, the clock input to the storage circuit includes transitions that cause the feedback path to be active, and during the second mode of operation, the clock input to the storage circuit does not include transitions that cause the feedback path to be active, and the clock input to the storage circuit has a state that causes the feedback path to be inactive.

7. The latch circuit of claim 6 wherein the clock producer circuit comprises:
an inverter with a weak P transistor and a strong N transistor for processing the clock input; and
an inverter with a weak N transistor and a strong P transistor for processing an inverted version of the clock input.

8. A flip-flop comprising first and second latch circuits according to claim 7 with roles of the clock input and the inverted clock input reversed for the second latch circuit.

9. The latch circuit of claim 6 wherein the clock producer circuit comprises:
a first inverter with a weak P transistor and a strong N transistor for processing the clock input, and a second inverter that inverts the output of the first inverter; or
a first inverter with a weak N transistor and a strong P transistor for processing an inverted version of the clock input and a second inverter that inverts the output of the first inverter.

10. The latch circuit of claim 1 wherein the forward data path transmission circuit comprises a clocked inverter.

11. The latch circuit of claim 1 wherein the forward data path transmission circuit comprises an inverter and a transmission gate.

12. The latch circuit of claim 1 wherein:
the feedforward path comprises a first inverter;
the feedback path connects an output of the first inverter to an input of the first inverter and comprises a clocked inverter.

13. The latch circuit of claim 1 wherein:
the feedforward path comprises a first inverter;
the feedback path connects an output of the first inverter to an input of the first inverter and comprises an inverter and a transmission gate.

14. A flip-flop comprising first and second latch circuits according to claim 1.

15. An integrated circuit comprising the latch circuit of claim 1.

16. A SerDes (serializer deserializer) comprising:
a serializer;
a deserializer comprising a demultiplexer comprising the latch circuit of claim 1.

17. The SerDes of claim 16 comprising a DFE (decision feedback equalizer), the DFE comprising said latch circuit.

18. A circuit comprising:
at least one flip-flop, each flip flop comprising first and second latch circuits according to claim 1;
a clock producer circuit comprising:
an inverter with a weak P transistor and a strong N transistor that processes the input clock and outputs a third clock;
an inverter with a weak N transistor and a strong P transistor that processes an inverted version of the input clock and outputs a fourth clock;
an inverter with a weak P transistor and a strong N transistor that processes the inverted version of the input clock and outputs a fifth clock;
an inverter with a weak N transistor and a strong P transistor that processes the input clock and produces a sixth clock;
wherein the storage circuit of each first latch circuit operates based on the third clock and the fourth clock, and the storage circuit of each second latch circuit operates based on the fifth clock and the sixth clock.

19. A circuit comprising:
at least one flip-flop, each flip flop comprising first and second latch circuits according to claim 1;
a clock producer circuit comprising:
an inverter with a weak P transistor and a strong N transistor that processes the input clock and outputs a third clock;
an inverter that inverts the third clock to produce a fourth clock;
an inverter with a weak P transistor and a strong N transistor that processes the inverted version of the input clock and outputs a fifth clock;
an inverter that inverts the fifth clock to produce a sixth clock;
wherein the storage circuit of each first latch circuit operates based on the third clock and the fourth clock, and the storage circuit of each second latch circuit operates based on the fifth clock and the sixth clock.

20. The latch circuit of claim 3 wherein the circuit that controls whether the storage circuit is in the first mode of operation or the second mode of operation receives a control input, and controls whether the storage circuit is in the first mode of operation or the second mode of operation based on the control input.

21. A flip-flop comprising first and second latch circuits according to claim 1, and further comprising a clock producer circuit that controls whether the storage circuit of the first latch circuit is in the first mode of operation or the second mode of operation, and controls whether the storage circuit of the second latch circuit is in the first mode of operation or the second mode of operation.

22. A method comprising:
providing a data input to a clocked inverter or an inverter in combination with a transmission gate, based on an input clock and an inverted input clock;
passing an output of the clocked inverter or an inverter in combination with a transmission gate to a storage circuit having an inverter in a forward path and a clocked inverter or an inverter in combination with a transmission gate in a feedback path, the feedback path having a clocked NMOS device and a clocked PMOS device
generating clock signals for the clocked NMOS device and the clocked PMOS device from the input clock and the inverted input clock such that for some input clock frequencies, the generated clock signals include transitions that cause the clocked NMOS and PMOS devices in the feedback path to be active, and for other input clock frequencies, the generated clock signals do not include transitions that cause the clocked PMOS and NMOS devices to be active, and have states that cause clocked PMOS and NMOS devices to be inactive.

* * * * *